(12) United States Patent
Flanders

(10) Patent No.: US 7,027,472 B2
(45) Date of Patent: Apr. 11, 2006

(54) FIXED WAVELENGTH SINGLE LONGITUDINAL MODE COOLERLESS EXTERNAL CAVITY SEMICONDUCTOR LASER SYSTEM

(75) Inventor: Dale C. Flanders, Lexington, MA (US)

(73) Assignee: Axsun Technologies, Inc., Billerica, MA (US)

( * ) Notice: Subject to any disclaimer, the term of this patent is extended or adjusted under 35 U.S.C. 154(b) by 96 days.

(21) Appl. No.: 09/909,330

(22) Filed: Jul. 19, 2001

(65) Prior Publication Data

US 2003/0016709 A1   Jan. 23, 2003

(51) Int. Cl.
    *H01S 3/10*   (2006.01)
(52) U.S. Cl. .......................... 372/26; 372/20
(58) Field of Classification Search .............. 372/20, 372/70, 26; 359/187, 183
    See application file for complete search history.

(56) References Cited

U.S. PATENT DOCUMENTS

| | | | | |
|---|---|---|---|---|
| 4,785,454 A | | 11/1988 | Olsson et al. .................. 372/26 |
| 4,818,053 A | * | 4/1989 | Gordon et al. ................. 385/93 |
| 4,998,256 A | * | 3/1991 | Ohshima et al. .............. 372/32 |
| 5,127,072 A | * | 6/1992 | Blauvelt et al. ............... 385/88 |
| 5,530,714 A | * | 6/1996 | Vilhelmsson et al. ......... 372/92 |
| 5,646,774 A | * | 7/1997 | Takara et al. ................ 359/340 |
| 6,041,071 A | * | 3/2000 | Tayebati ........................ 372/64 |
| 6,097,742 A | * | 8/2000 | Caprara et al. ................ 372/22 |
| 6,205,159 B1 | * | 3/2001 | Sesko et al. ................... 372/20 |
| 6,235,141 B1 | | 5/2001 | Feldman et al. ............ 156/250 |
| 6,285,702 B1 | * | 9/2001 | Caprara et al. ................ 372/92 |
| 6,339,603 B1 | * | 1/2002 | Flanders et al. .............. 372/20 |
| 6,345,059 B1 | * | 2/2002 | Flanders ....................... 372/20 |
| 6,366,592 B1 | * | 4/2002 | Flanders ....................... 372/18 |
| 6,424,450 B1 | * | 7/2002 | Goossen ...................... 359/290 |
| 6,438,147 B1 | * | 8/2002 | Roychoudhuri et al. ...... 372/20 |
| 6,466,185 B1 | * | 10/2002 | Sullivan et al. ................. 345/6 |
| 6,507,593 B1 | * | 1/2003 | Spinelli et al. ................ 372/20 |
| 6,650,810 B1 | * | 11/2003 | Lieberman et al. ........... 385/37 |
| 2003/0021303 A1 | * | 1/2003 | Daiber ......................... 372/20 |
| 2003/0021308 A1 | * | 1/2003 | Kuznetsov et al. ........... 372/32 |

OTHER PUBLICATIONS

C489-Type 2.5 Gbits/s, Tunable, Stabilized, Long-Haul DBR Laser Transmitters, Agere Systems, Preliminary Data Sheet, Mar. 2001.
Using Electroabsorptive Modulated Laser Modules in Dense WDM Applications, Lucent Technologies, Microelectronics Group, Technical Note, Aug., 2000.

* cited by examiner

*Primary Examiner*—Minsun Oh Harvey
*Assistant Examiner*—Dung (Michael) Nguyen
(74) *Attorney, Agent, or Firm*—Houston Eliseeya LL

(57) ABSTRACT

A fixed wavelength, external cavity semiconductor laser comprises a semiconductor laser gain medium and an intra-cavity filter having a filter function specifying a frequency of operation of the laser. This distinguishes it from distributed feedback Bragg reflector systems in which the wavelength of operation is dictated by the semiconductor Bragg grating, drive current, and temperature. A cavity length modulation system is further provided that modulates an optical length of the cavity to change the spectral locations of longitudinal modes of the cavity relative to the filter function. One important advantage of the present invention is that it can be deployed without a thermoelectric (TE) cooler. Specifically, the intra-cavity filter material in combination with the cavity length controller, allow a mode of cavity to be located at the filter function. Thus, the temperature of the module can fluctuate with ambient temperature or other operating parameters, but the wavelength is held stable with single longitudinal mode operation of the module being guaranteed.

21 Claims, 7 Drawing Sheets

FIXED WAVELENGTH SINGLE LONGITUDINAL MODE COOLERLESS EXTERNAL CAVITY SEMICONDUCTOR LASER SYSTEM

BACKGROUND OF THE INVENTION

Single longitudinal mode, with a fixed or narrowly tunable wavelength, semiconductor lasers are typically deployed in modulated transmitter modules for wavelength division multiplexed (WDM) optical data communication applications. Their semiconductor gain media can be directly modulated or the lasers can be deployed with separate external modulators based on Pockel's cells, directional couplers, Fabry-Perot etalons, Mach-Zehnder interferometers, or electroabsorptive chips.

A common module configuration includes a 1.3–1.6 micrometer (μm) distributed feedback Bragg (DFB) laser chip, a backfacet photodetector, an electroabsorptive modulator, a wavelength locker and associated electronics, a thermistor, an isolator, and an thermoelectric cooler. These devices are applicable to terminal equipment in WDM applications from metro to extended-reach systems, operating at 2.5 gigabits per second (Gbps) and higher.

SUMMARY OF THE INVENTION

The complexity of these modulated laser modules is driven largely by the wavelength accuracy required in WDM systems, for example. With channel spacings on the order 100 GigaHertz (GHz) and less, good wavelength stability is required in these modules over various environmental conditions and time. This stability specification leads to the requirement for the wavelength locker. Modules without lockers are susceptible to wavelength drift with drive current, chip temperature, thermistor aging, and environmental stress. This complexity, however, translates into high unit cost and increased power consumption, in addition to a large form factor.

The present invention concerns a fixed wavelength semiconductor laser system and module. Specifically, it provides an accurate and spectrally stable laser emission. In contrast to prior art devices, however, the system can have a simpler module configuration in addition to reduced power requirements.

In general, according to one aspect, the invention features a fixed wavelength, external cavity semiconductor laser. The laser comprises a semiconductor laser gain medium and an intra-cavity filter having a filter function specifying the frequency of operation of the laser. This distinguishes it from distribute feedback or distributed Bragg reflector (DBR) systems in which the wavelength of operation is dictated by the semiconductor Bragg grating, drive current, and temperature. A cavity length modulation system is further provided that modulates an optical length of the cavity to change the spectral locations of longitudinal modes of the cavity relative to the filter function.

In one embodiment, the intra-cavity filter is angled relative to an axis of the cavity to avoid the coupling of reflected light from the intra-cavity filter into the semiconductor gain medium. In an alternative implementation, two polarization rotators are provided on either side of the intra-cavity filter. They rotate a polarization of light in the cavity so that light within the filter function has a polarization for amplification in the semiconductor medium whereas light outside the filter function has a different, or orthogonal, polarization.

In one implementation, the polarization rotators comprise quarter waveplates. Alternatively, however, subwavelength period gratings can be used.

In the present implementation, the semiconductor gain medium is a semiconductor optical amplifier. For example, in one implementation, a backfacet of the amplifier is coated to be reflective whereas a front facet is antireflection coated.

In order to detect light generated by the semiconductor optical amplifier, a backfacet detector can be oriented to detect light emitted from the chip's backfacet; a front monitor detector can be oriented to detect light that is output from the laser cavity.

In one implementation, a partial reflector is inserted in the beam that is generated by the laser cavity to direct light to the front monitor.

A window structure can be provided in a hermetic cover, through which the output beam from the cavity is transmitted. In a specific implementation, this window structure can also be used to direct a portion of the output to the front monitor detector.

In some applications, an isolator is required. In the preferred embodiment, this isolator is installed on the bench, but external to the cover. As a result, epoxy can be used when attaching the isolator to the bench. Further, focusing lenses can be provided to couple light exiting from the cover into a fiber pigtail.

One important advantage of the present invention is that it can be deployed without a thermoelectric (TE) cooler. Specifically, temperature-stable intra-cavity filter material in combination with the cavity length controller allow a longitudinal mode of cavity to be located at the temperature-invariant filter function. Thus, while the temperature of the module may fluctuate with ambient temperature or other operating parameters, the wavelength is held stable with single longitudinal mode operation of the module being guaranteed.

In general, according to another aspect, the invention features a composite filtering structure. This structure comprises spectral filter material, in combination with at least one polarization rotator, which is attached to one side of the filter material. A collimating lens is attached to the filtering material for coupling a beam into and/or out of the filter material.

In a current implementation, a second polarization rotator is attached to the opposite side of the filter material relative to the first polarization rotator.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
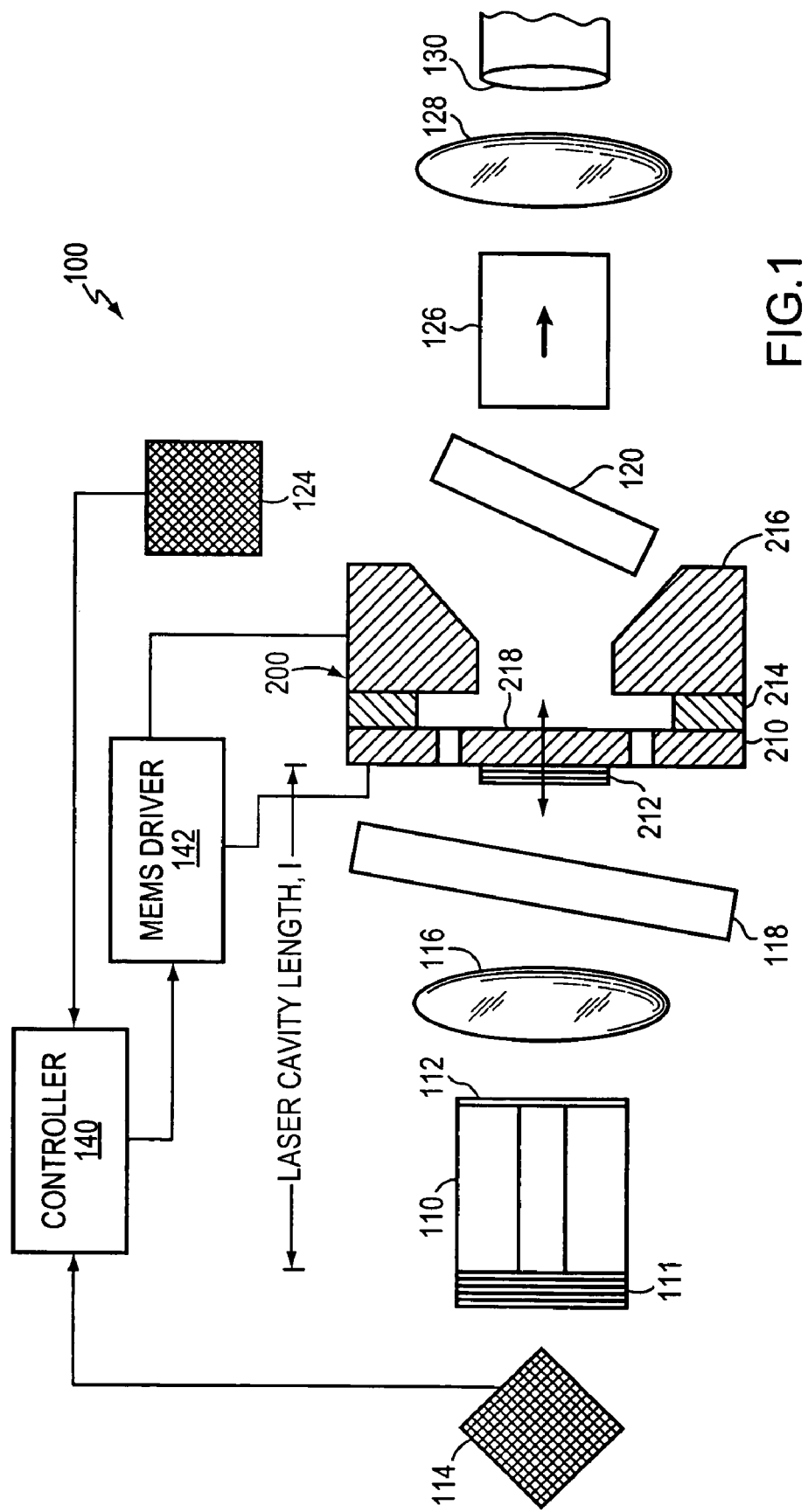
FIG. 1 is schematic diagram showing an external cavity semiconductor laser system, according to the present invention.

FIG. 1 illustrates a fixed wavelength, single longitudinal mode external cavity semiconductor laser system, which has been constructed according to the principles of the present invention.

Specifically, the laser 100 comprises a semiconductor gain medium 110. In the present implementation, this semiconductor gain medium is a semiconductor optical amplifier (SOA). The invention, however, is relevant to other electrically, or even optically, pumped gain media.

For example, a vertical cavity surface emitting laser (VCSEL) gain medium is used in one alternative. Here, the VCSEL substrate is has an AR front and/or rear coating to yield SOA behavior. This VCSEL configuration is sometimes referred to as a half-cavity VCSEL. One advantage of using VCSEL substrates is that they tend to be short, thereby allowing shorter laser cavity lengths.

The light generated in the gain medium 110 is coupled into the endface 130 of a fiber optic pigtail. This pigtail is typically constructed from single mode or polarization-maintaining (PM) optical fiber.

In the illustrated embodiment, the backfacet of the semiconductor gain medium 110 has a highly reflective (HR) thin film coating 111. This coating is typically alternating layers of high index and low index dielectric material, each typically being about one-quarter wavelength in thickness.

In the illustrated example, a backfacet detector 114 is installed behind the backfacet. It detects any light that is transmitted through the HR backfacet coating 111. It is therefore useful to detect the light intensity in the semiconductor gain medium 110.

The front facet of the semiconductor gain medium 110 preferably has an anti-reflective (AR) coating 112. This is an index matching coating between the bulk material of the semiconductor medium and typically air. The light exiting from the medium 110 is typically diverging. As a result, a coupling lens 116 installed in front of the front facet.

In some implementations, this front facet coupling lens 116 can be avoided, however, especially where the mode in the semiconductor gain medium is large, i.e., greater than about 5 micrometers (μm).

An intra-cavity filter 118 is further provided in the external cavity. This filter has a filter function specifying the frequency of operation of the laser. In this embodiment, the intra-cavity filter 118 is angled relative to optical axis of the laser cavity. This ensures that the laser does not lase on the wavelengths reflected by the intra-cavity filter 118.

In the illustrated example, the intra-cavity filter has transmission or pass band at the desired wavelength or frequency of operation for the laser 100.

Alternatively, in other, folded, cavity configurations, the cavity filter 118 is a notch filter in transmission, with the cavity resonating on the reflection from the intra-cavity filter 118.

A cavity length modulation system 200 is provided to define the other end of the laser cavity, enabling the modulation of the optical length of the laser cavity. As a result, by tuning the optical length of the cavity, the spectral locations of the longitudinal modes of the external cavity are shifted relative to the filter function of the intra-cavity filter 118.

In the illustrated embodiment, the cavity length modulation system 200 is implemented as a microelectromechanical system (MEMS) device. Specifically, the MEMS device comprises a deflectable structure such as membrane 218, which is deflected out-of-plane by electrostatic forces.

In other implementations, rather than a membrane, a MEMS cantilevered structure is used.

A reflective layer 212 is deposited on the membrane 218. This is preferably a low loss layer that provides between 1% and 20% power reflectivity into the laser cavity. In the present embodiment, the reflectivity is between 5 and 10%.

The illustrated MEMS membrane device 200 comprises a sacrificial layer 214 separating the device or membrane layer 210 from the handle wafer 216. U.S. patent application Ser. No. 09/797,529, filed on 1 Mar. 2001, entitled "Integrated Tunable Fabry-Perot Filter and Method of Making Same", discloses additional details concerning the fabrication of an exemplary tunable MEMS optical membrane device, this application being incorporated herein by this reference in its entirety.

Light that is not reflected by the membrane reflective layer 212 passes through the optical port in the handle wafer and from the laser cavity.

In the illustrated embodiment, a partial reflector 120 is provided to reflect a portion of the output beam to a front detector 124. This allows the sampling of the intensity of the output beam. The remainder of the output beam passes through an isolator 126 to a focusing lens 128, which couples the output beam into optical fiber through endface 130.

Controller 140 receives the responses from the backfacet detector 114 and the front detector 124. From these responses, the controller 140 is able to monitor front-to-back power ratio, absolute intensity of light in the laser cavity, and the intensity of light being generated by the laser in the output beam. The front to back ratio provides information concerning the location of the cavity mode relative to the filter function of the intra-cavity filter 118, thus providing wavelength information.

Generally, the controller 140 tunes the cavity length modulator 200 with the MEMS driver 142 based on the response of the front detector 124. For example, the modulator 200 is tuned to maximize the output power for a given semiconductor gain medium drive current so that a cavity mode is located at the transmission peak of the intra-cavity filter 118.

Figure 2:
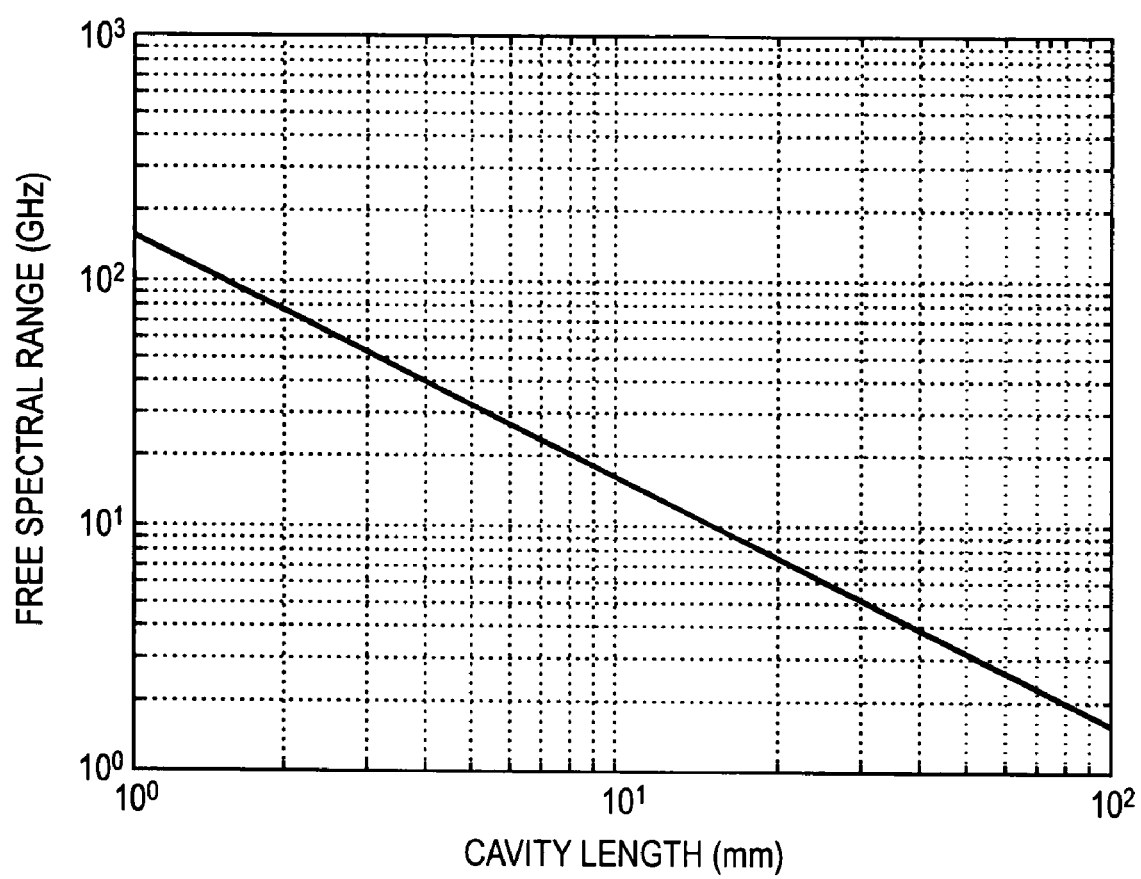
FIG. 2 is a plot of free spectral range as a function of effective cavity length in air.

FIG. 2 illustrates the relationship between the effective cavity length in air and the free spectral range or spectral distance between the longitudinal modes of the cavity. Shorter cavities yield a longer spectral distance between the cavity modes. And, this distance between cavity modes dictates the required line width of the filter function of the intra-cavity filter 118.

According to the invention, the intra-cavity filter restricts the cavity to resonating in only one longitudinal mode to thereby yield a single frequency laser system. The greater spectral distance between the cavity modes, the larger the acceptable bandwidth for the intra-cavity filter.

Preferably, the cavity 1 should have an equivalent length in air of less than 10 millimeters (mm), preferably less than 3 mm. This translates to a free spectral range of greater than 15 Gigahertz (GHz) and 4 GHz, respectively. As a result, the spectral filter function 118 of the intra-cavity filter 118 merely needs to discriminate between correspondingly spaced longitudinal cavity modes.

Preferably, the air equivalent cavity length is less than two millimeters, thereby further easing the bandwidth of the intra-cavity filter 118 so that it needs to discriminate between longitudinal modes that are spaced at approximately 10 GHz, or farther apart, spectrally. Half-cavity VCSEL are preferred for these very short cavity configurations.

Figure 3:
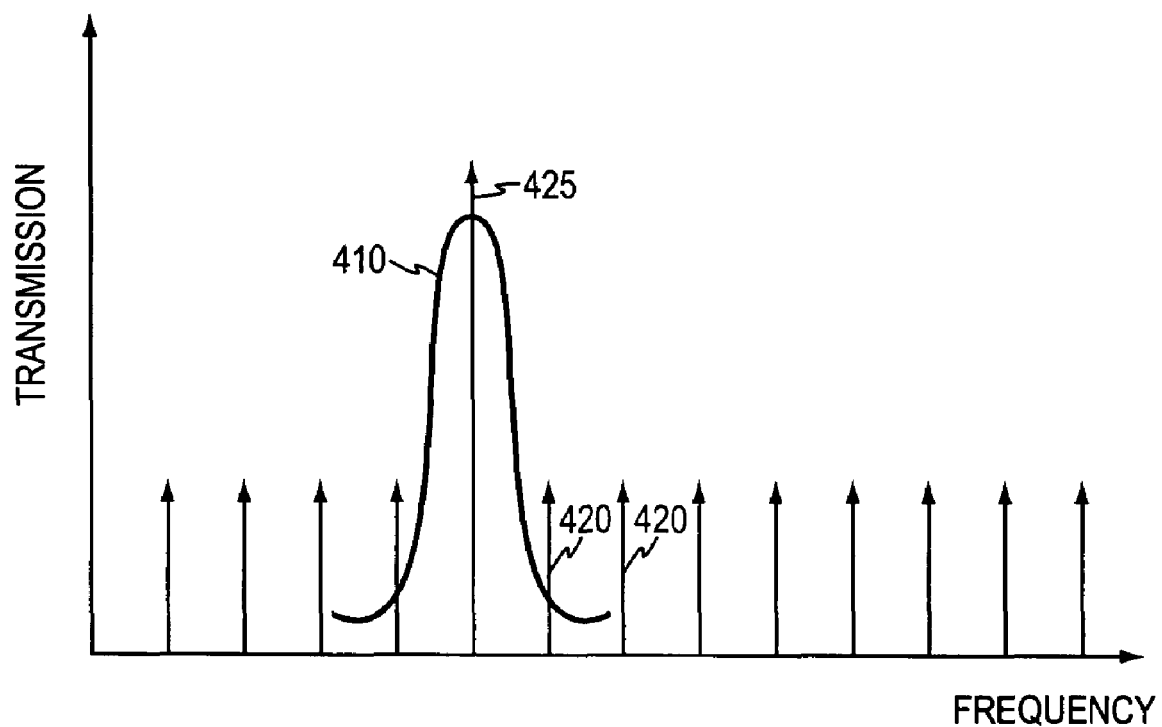
FIG. 3 is a schematic plot of transmission as a function of frequency for the intra-cavity filter and the relationship to the spectral locations of the longitudinal modes of the laser's external cavity.

FIG. 3 is a plot of transmission through the intra-cavity filter 118 as a function of frequency. Curve 410 illustrates a passband for the intra-cavity filter 118. Also shown are the spectral positions of the cavity modes 420 for the external laser cavity.

The filter function 410 of the intra-cavity filter 118 allows only one of these modes 425 to lase or resonate with net gain in the cavity. As discussed previously, the shorter the laser cavity, the larger the spectral distance between these cavity modes 420. This loosens the spectral tolerances or the "sharpness" of the filter function 410 of the intra-cavity filter 118.

Figure 4:
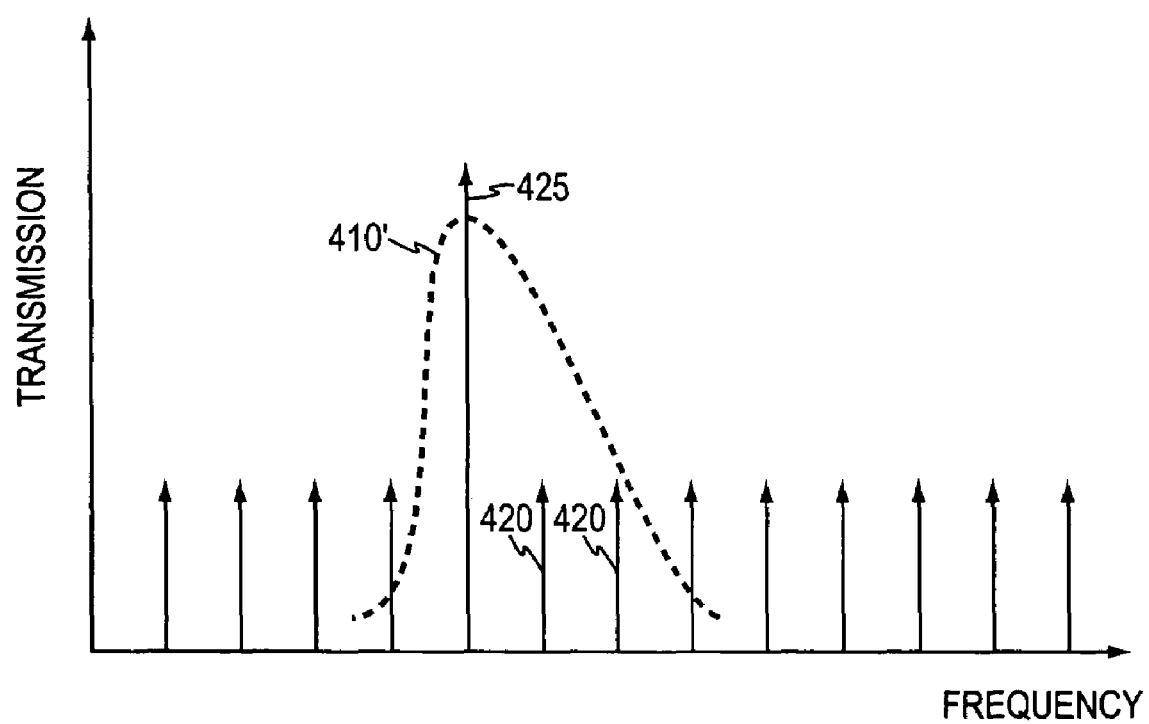
FIG. 4 is a schematic plot of transmission as a function of frequency for a second embodiment of the intra-cavity filter and the relationship to the spectral locations of the longitudinal modes of the laser's external cavity.

FIG. 4 illustrates an alternative filter function shape 410' for the intra-cavity filter 118. Here, the filter function is spectrally asymmetric. Specifically, one side of the filter function's peak has a steep slope, i.e., a small change in frequency results in a large change in transmission. The slope of other side is lower.

This implementation is advantageous insofar as it eases some of the control issues associated with the cavity length modulation system and specifically the control algorithm executed by the controller 140. It is easier to discover the direction to tune the cavity length so that the cavity mode 425 resides at the peak of the filter function 410'. Typically, the degree to which the magnitude of the output beam changes as a function of cavity length changes indicates on which side of the filter function the cavity mode resides.

Figure 5:
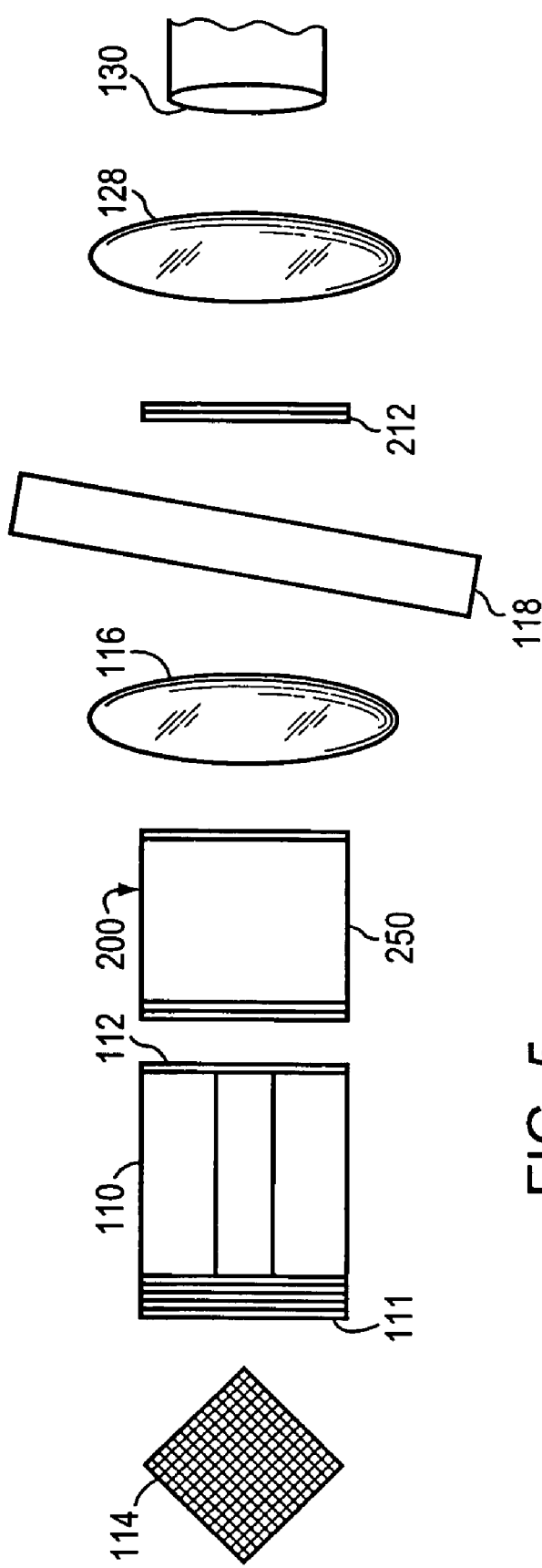
FIG. 5 is schematic diagram showing an external cavity semiconductor laser system according to a second embodiment.

FIG. 5 illustrates an alternative implementation of the cavity length modulation system 200. Specifically, in this embodiment, system 200 comprises a semiconductor device or chip 250 with a P-N junction and an active waveguide layer. This active layer is typically surrounded by upper and lower cladding layers. In the illustrated embodiment, both the front and back facets of the semiconductor cavity length modulation chip 250 are AR coated.

The cavity length modulator chip 250 in combination with the semiconductor gain medium 110 function as a cleaved-coupled laser system as described in U.S. Pat. No. 4,785,454, for example. Specifically, by regulating the bias to the chip 250, the refractive index of the chip's semiconductor material is modulated. Changes in this refractive index change the optical length of the laser cavity between back reflector 111 and the stationary or fixed front reflector 212. These optical length changes allow the electrical tuning of the spectral location of the external laser's cavity modes.

Alternatively, the cavity length modulator chip 250 is integrated on a single chip with the semiconductor gain medium 110 using a multiple electrode. e.g., split contact, configuration.

While no isolator is illustrated in this FIG. 5 embodiment, an isolator could be located outside the laser cavity as shown in connection with FIG. 1, depending on the degree of wavelength stability required.

Figure 6:
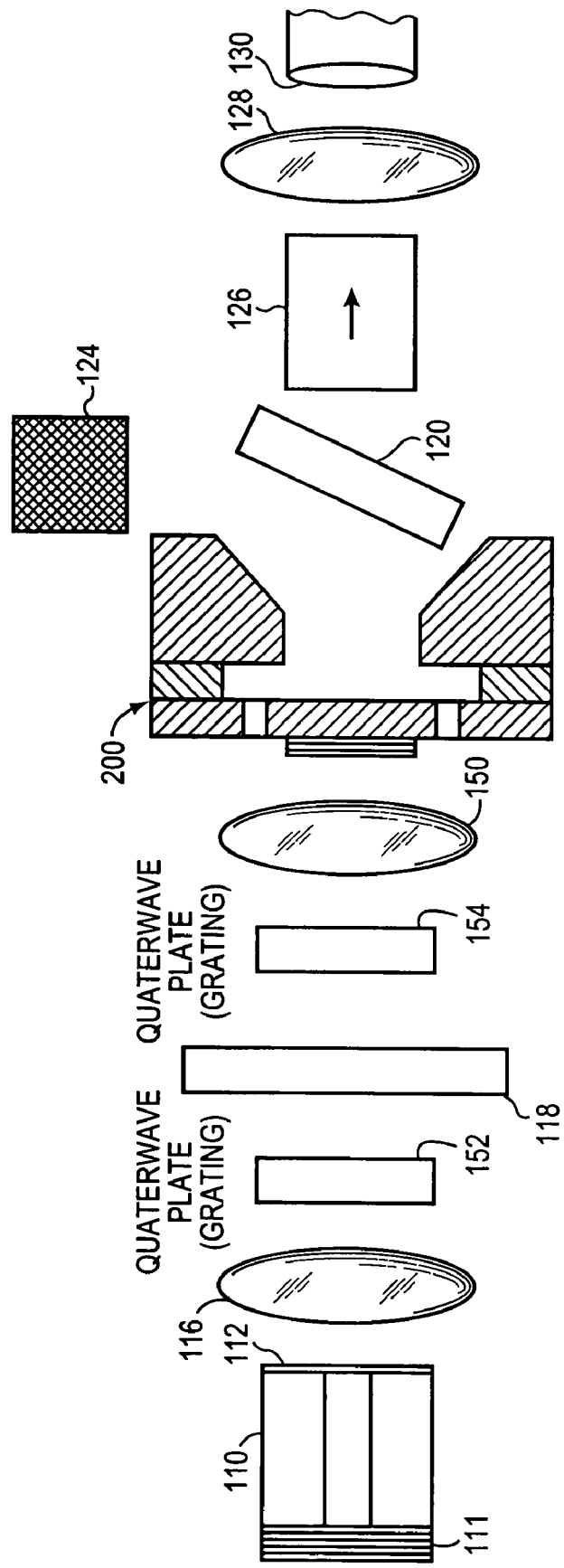
FIG. 6 is schematic diagram showing an external cavity semiconductor laser system according to a third embodiment.

FIG. 6 shows still another embodiment of the fixed wavelength external cavity semiconductor laser. In this embodiment, the intra-cavity filter 118 is not angled. Lasing of the external cavity on light reflected by the intra-cavity filter 118 is instead avoided through the use of polarization rotators 152,154. Quarterwave plate polarization rotators or Faraday rotators are used in some implementations.

In an alternative implementation, sub-wavelength period gratings are used. Such gratings, as described in *Applied Physics Letters* 42 (6), Mar. 15, 1983, page 492, do not diffract the light, but instead operate as a homogenous birefringent material to rotate the polarization of the beam. In one example, the gratings are etched, or otherwise formed, onto a side of a bulk substrate to a depth required for quarterwave operation. In still other implementations, the polarization rotation is performed by liquid crystal, preferably in photopolymerizable polymer utilizing photo-alignment.

In operation, the polarization rotator 152 rotates light that is reflected by the intra-cavity filter 118 by a total of 90 degrees in two passes. This reflected light is not amplified in the semiconductor gain medium because of the polarization anisotropy associated with such gain mediums. In contrast, light that is transmitted through the filter material 118 and reflected by the end of the cavity is rotated 180 degrees and thus, will be amplified by the gain medium.

Figure 7:
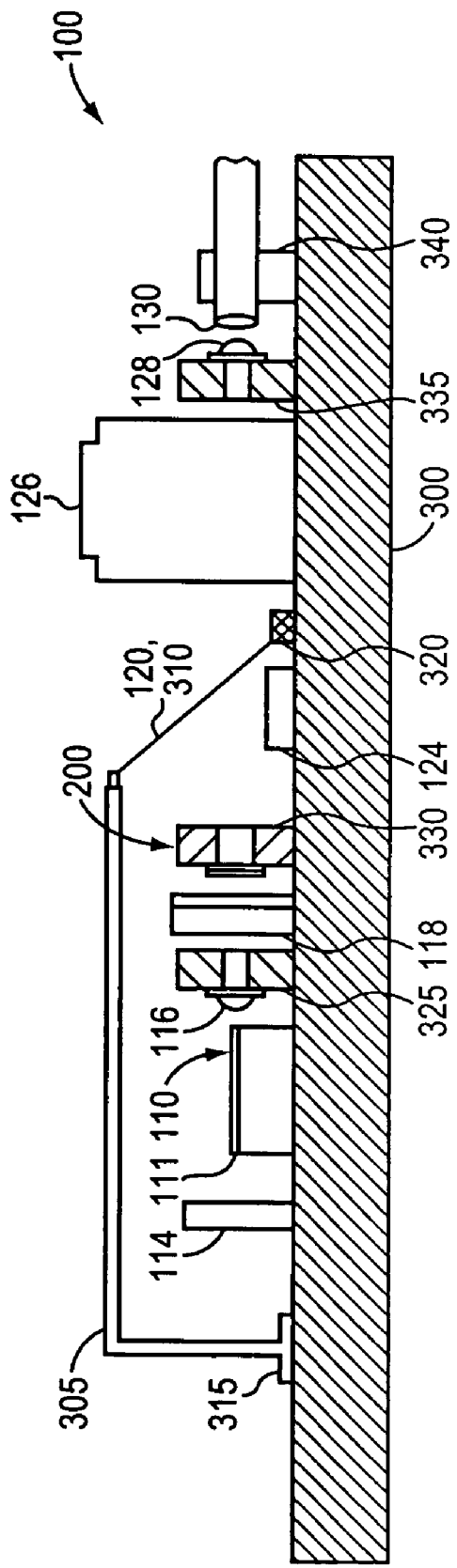
FIG. 7 is schematic elevation showing the hybrid integration of the external cavity semiconductor laser system on an optical bench according to the present invention.

FIG. 7 illustrates a hybrid implementation of the inventive semiconductor laser system 100. Specifically, in the illustrated example, the detector 114, lens 116, intra-cavity filter 118, and MEMS membrane 200 are installed "tombstone" fashion on a bench or submount 300. Specifically, the hybrid components are installed so that they extend orthogonal to a top surface of the bench 300. In the illustrated embodiment, mounting structures 325 and 330 are used to hold the lens 116 and the MEMS cavity length modulator 200.

In one implementation, the laser system's cavity is hermetically sealed by a cover 305, which is welded or otherwise bonded to the bench 300 via the interface 315. A front window 310 is provided through which the beam is transmitted outside the cover and across the hermetic boundary. In the illustrated example, this window is a pellicle window that also functions as a partial reflector to direct some of the output beam to the front detector 124.

The isolator 126 is preferably located outside the hermetic boundary, but installed commonly on the optical bench 300. Since it is outside the hermetic boundary, epoxies or other organic materials can be used to bond the isolator 126 to the bench 300 thereby easing packaging requirements. According to the preferred embodiment, the focusing lens 128 is installed on a mounting structure 335 also outside the hermetic region to couple light into the fiber through endface 130, which is installed on the bench via a fiber mounting bench 340.

In the preferred embodiment, the temperature of the laser system is allowed to fluctuate with the ambient temperature or output power. Thus, no TE cooler is used under the bench 300, for example.

Figure 9:
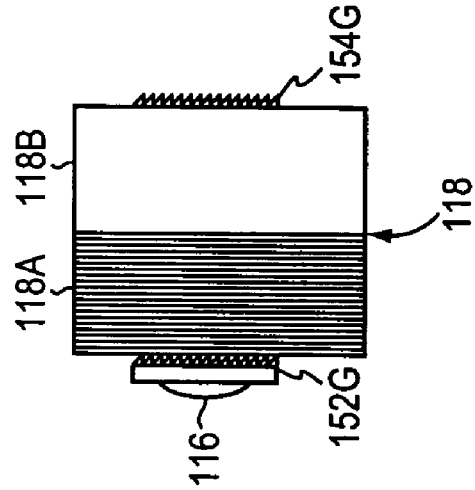
FIG. 9 is a plan view of a composite filtering structure according to another embodiment.
Figure 8:
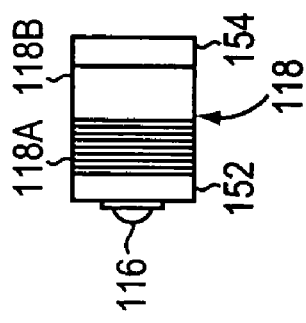
FIG. 8 is a plan view of a composite filtering structure according to the invention.

In order to minimize the length of the laser cavity, composite filtering structures are preferably provided as illustrated in FIGS. 8 and 9.

FIG. 8 shows the intra-cavity filter 118 as preferably comprising a stack of dielectric layers 118A that have been deposited on a substrate 118B. Rotator or birefringent material or specifically quarter waveplates 152 and 154 are preferably directly bonded to the front and backsides of the filter 118. According to the preferred implementation, the substrate in which the lens 116 is formed is then further bonded to these quarter waveplate or rotator materials. This composite structure enables further shortening of the cavity length of the laser's external cavity.

FIG. 9 shows an embodiment utilizing subwavelength period gratings. In this example, the gratings are directly formed on the frontside and backside of the filter material 118. This can be performed by adding another layer to the dielectric material side 118A and the substrate side 118B of the filter 118 and then lithographically patterning and etching this layer. As also shown, the substrate for the lens 116 can then be bonded to this grating.

Thermal/Power Compensation Strategies

The present invention generally operates in a single longitudinal mode because of the combination of the filter function and the wide spectral spacing of the cavity modes. In most regimes of operation, only one longitudinal mode will lase, thereby guaranteeing single frequency operation.

Operation at a fixed wavelength is largely dependent upon the temperature stability of the intra-cavity filter 118. Generally, without an extra wavelength locker/meter, the controller 140 tunes the cavity modes so that the output power is maximized for a given injection current to the semiconductor gain medium. This maximum power will typically occur at the transmission peak/reflection peak for the intra-cavity filter material 118. Thus, changes in the filter function with temperature will degrade wavelength stability of the laser 100.

One strategy for ensuring fixed wavelength operation is to focus on thermal compensation of the intra-cavity filter 118. This is typically achieved by fully characterizing the temperature dependant behavior of the etalon/thin film filter material 118 and selecting the substrate material to yield a thermally compensated device.

Another solution, avoiding the need to fully temperature compensate the intra-cavity filter is to thermally isolate and/or temperature control the intra-cavity filter 118.

In one embodiment, the filter material is thermally isolated from the bench 300 and other components. As a result, its temperature is largely dictated by optical power dissipation from the laser beam balanced by the radiation and convection cooling. Thus, during laser operation, the filter 118 reaches a steady-state temperature. The filter material is selected such that at this steady-state temperature the filter function is known with the filter function or passband at the fixed wavelength.

In an alternative embodiment, the intra-cavity filter 118 is actively temperature controlled. This is accomplished, in one implementation, by preferably thermally isolating the intra-cavity filter 118 and then including a heater element on the filter material and possibly a temperature detector. One example uses a combination of a thermistor and a resistive heater that are operated by the controller 140. The temperature control loop for the filter material 118 guarantees a temperature stable intra-cavity filter and therefore, filter function, regardless of an ambient environment in which the laser is operating. Generally, the temperature is controlled to be higher than the maximum temperature an unheated filter would reach with the laser operating at maximum power output and the maximum ambient temperature specified for the device.

While requiring the addition of a thermistor and a resistive heater, this implementation still maintains a number of advantages over prior art fixed wavelength lasers. The filter's resistive heater consumes much less energy than a module TE cooler; and the thermistor can be lower quality since some temperature drift for the filter material can tolerated if the filter material is compensated against such shifts.

While this invention has been particularly shown and described with references to preferred embodiments thereof, it will be understood by those skilled in the art that various changes in form and details may be made therein without departing from the scope of the invention encompassed by the appended claims.

What is claimed is:

1. A semiconductor laser, comprising:
    a semiconductor gain medium for a linear laser cavity;
    an intracavity filter, in the laser cavity, having a filter function specifying a frequency of operation of the laser; and
    modulation system that modulates an optical length of the laser cavity to change spectral locations of longitudinal modes of the laser cavity relative to the filter function;
    wherein a temperature of the system is allowed to fluctuate with ambient temperature while the modulation system modulates the optical length of the laser cavity to change spectral locations of longitudinal modes of the laser cavity relative to the filter function.

2. A laser as claimed in claim 1, wherein the intracavity filter is angled relative to an axis of the cavity to avoid coupling of light reflected by the intracavity filter into the semiconductor gain medium.

3. A laser as claimed in claim 1, further comprising two polarization rotators, on either side of the intracavity filter, that rotate a polarization of light in the cavity with the light at the filter function having a polarization for amplification in the semiconductor gain medium and light outside the filter function being at an orthogonal polarization.

4. A laser as claimed in claim 3, wherein the polarization rotators comprise quarterwave plates.

5. A laser as claimed in claim 3, wherein the polarization rotators comprise subwavelength period gratings.

6. A laser as claimed in claim 1, wherein the semiconductor gain medium is a semiconductor optical amplifier.

7. A laser as claimed in claim 1, wherein the semiconductor gain medium has an antireflection coated front facet and a backfacet coated to be reflective.

8. A laser as claimed in claim 1, further comprising a backfacet monitor diode oriented to detect light emitted from a backfacet of the semiconductor gain medium.

9. A laser as claimed in claim 1, further comprising a front monitor diode oriented to detect light output from the cavity.

10. A laser as claimed in claim 1, further comprising:
    a partial reflector inserted in an output beam from the cavity; and
    a front monitor diode oriented to detect light reflected by partial reflector.

11. A laser as claimed in claim 1, wherein the modulation system, semiconductor gain medium, and intracavity filter are located within a hermetic cover.

12. A laser as claimed in claim 11, further comprising a window structure in the cover, through which an output beam from the cavity is transmitted.

13. A laser as claimed in claim 12, further comprising a front monitor diode, the window structure being angled relative to an axis of the output beam to reflect light from the output beam to the front monitor diode.

14. A laser as claimed in claim 12, further comprising an isolator, installed on the bench external to the cover, receiving the output beam after transmission through the window structure.

15. A laser as claimed in claim 12, further comprising a focusing lens and an optical fiber pigtail that are installed on the bench external to the cover, the focusing lens coupling the output beam, after transmission through the window structure, into the fiber pigtail.

16. A laser as claimed in claim 1, wherein the temperature of the system is uncontrolled.

17. A laser as claimed in claim 1, wherein the modulation system comprises a deflectable MEMS structure.

18. A laser as claimed in claim 1, wherein the modulation system comprises a deflectable membrane structure.

19. A laser as claimed in claim 1, wherein the modulation system comprises a semiconductor substrate.

20. A semiconductor laser, comprising:

a semiconductor gain medium for a laser cavity;

an intracavity filter, in the laser cavity, having a filter function specifying a frequency of operation of the laser; and modulation system that modulates an optical length of the laser cavity to change spectral locations of longitudinal modes of the laser cavity relative to the filter function;

wherein a temperature of the system is allowed to fluctuate with ambient temperature while the modulation system modulates the optical length of the laser cavity to change spectral locations of longitudinal modes of the laser cavity relative to the filter function; and wherein the laser cavity oscillates in only a single longitudinal mode.

21. A semiconductor laser, comprising:

a semiconductor gain medium for a laser cavity;

an intracavity filter, in the laser cavity, having a filter function specifying a frequency of operation of the laser; and modulation system that modulates an optical length of the laser cavity to change spectral locations of longitudinal modes of the laser cavity relative to the filter function;

wherein a temperature of the system including the semiconductor gain medium is allowed to fluctuate with ambient temperature while the modulation system modulates the optical length of the laser cavity to change spectral locations of longitudinal modes of the laser cavity relative to the filter function.

* * * * *